(12) United States Patent
Rysinski et al.

(10) Patent No.: US 8,988,111 B2
(45) Date of Patent: Mar. 24, 2015

(54) CASCODED COMPARATOR WITH DYNAMIC BIASING FOR COLUMN PARALLEL SINGLE SLOPE ADCS

(75) Inventors: Jeff Rysinski, Pasadena, CA (US); Yibing Michelle Wang, Temple City, CA (US); Sang-Soo Lee, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 117 days.

(21) Appl. No.: 13/017,839

(22) Filed: Jan. 31, 2011

(65) Prior Publication Data

US 2012/0194261 A1    Aug. 2, 2012

(51) Int. Cl.
| | | |
|---|---|---|
| *H03K 19/00* | (2006.01) | |
| *H03K 19/02* | (2006.01) | |
| *H03F 3/45* | (2006.01) | |
| *H03K 5/24* | (2006.01) | |
| *H03M 1/12* | (2006.01) | |
| *H03M 1/56* | (2006.01) | |

(52) U.S. Cl.
CPC .......... *H03F 3/45188* (2013.01); *H03K 5/2481* (2013.01); *H03M 1/123* (2013.01); *H03M 1/56* (2013.01); *H03F 2203/45292* (2013.01); *H03F 2203/45302* (2013.01); *H03F 2203/45674* (2013.01)
USPC ............................................... 327/58; 327/50

(58) Field of Classification Search
CPC .. G01R 19/04; G01R 19/0038; H03K 5/1532; H03K 5/082; G11B 20/10009
USPC .................. 327/50–53, 56, 58, 63–66, 68
See application file for complete search history.

(56) References Cited

U.S. PATENT DOCUMENTS

| | | | | |
|---|---|---|---|---|
| 8,040,264 B2 * | 10/2011 | Hummerston et al. | ....... | 341/118 |
| 2003/0107431 A1 * | 6/2003 | Tang | ............................. | 327/563 |
| 2008/0246544 A1 * | 10/2008 | Fujino et al. | .................. | 330/278 |

* cited by examiner

*Primary Examiner* — Diana J Cheng
(74) *Attorney, Agent, or Firm* — William Park & Associates Patent Ltd.

(57) ABSTRACT

Aspects of the invention may include receiving a first input signal and a second input signal via respective first and second input transistors. A biasing signal, generated by a cascode bias generator, tracks the first input signal, where the biasing signal has a fixed offset with respect to the first input signal. The biasing signal may be applied to the first and second cascode transistors that may be cascoded to the first and second input transistors, respectively.

19 Claims, 6 Drawing Sheets

CASCODED COMPARATOR WITH DYNAMIC BIASING FOR COLUMN PARALLEL SINGLE SLOPE ADCS

FIELD OF THE INVENTION

Certain embodiments of the invention relate generally to comparators, and more particularly to a cascoded comparator with dynamic biasing for column parallel single slope ADCs.

BACKGROUND OF THE INVENTION

As computers and processors become more powerful, more and more signal processing is being done in the digital domain. Digital signal processing can perform complex operations to manipulate input data to approximate real world analog signals, and the operations can be performed in real time, or the digital data can be stored for future processing. Since real world signals exist as analog signals, these analog signals need to be converted to equivalent digital signals.

Analog to digital converters (ADCs) are used in many applications, such as, for example, converting analog control signals in industrial applications, audio signals in music, photographic images in digital cameras, and video images in digital video cameras. As with most circuits, there are many different types of ADCs where tradeoffs are made for different limitations. Some, such as the "flash" ADC, are relatively expensive in circuitry and layout space and, accordingly, limited in resolution since every additional bit requires doubling of the number of comparators, but very fast in conversion speed. Others, such as the ramp ADC, can be fairly simple but slow in conversion time. And as the amount of resolution increases, the conversion time will increase.

Accordingly, a particular application needs to take into account various limitations and determine which design best serves its purposes. However, picking a specific design, and possibly modifying it to improve its design, can still present certain challenges that need to be overcome.

For high resolution and high speed imaging, column parallel ADC architecture has become the most widely used ADC in CMOS image sensors. One key challenge to achieving good performance of CMOS image sensors is to reduce noise or other signal offsets from affecting the converted digital data.

With column parallel single slope ADCs, all comparators are connected to a common ramp signal. If there is a large uniform area in an image, many comparators may have the same pixel value. Accordingly, many comparators can toggle at the same time as the input ramp signal reaches the pixel voltage. The toggling comparator outputs can couple to the input ramp signal and create a glitch that can affect the conversion of other pixels in that row.

A method to eliminate this coupling is to cascode transistors to the comparator differential pair. With cascoded transistors, when the comparator outputs toggle the cascode transistor clamps the drain voltage of the input transistor so that there is no switching signal to couple to the input ramp signal. The problem with adding cascodes to the comparator input circuit is that the input signals are not constant and have a wide full scale range. Therefore it is difficult to select an optimal cascode bias voltage.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a cascoded comparator with dynamic biasing for column parallel single slope ADCs. Aspects of the invention may comprise receiving a first input signal and a second input signal via respective first and second input transistors. A biasing signal, generated by a cascode bias generator, may track the first input signal, where the biasing signal has a fixed offset with respect to the first input signal. The biasing signal may be applied to the first and second cascode transistors that may be cascoded to the first and second input transistors, respectively.

The first input signal is a downwardly ramping voltage signal and the second input signal is a sampled pixel voltage. The output signal may be dependent on comparison of a voltage level of the first input signal to a voltage level of the second input signal.

An embodiment of the invention for a cascoded comparator with dynamic biasing for column parallel single slope ADCs where the comparator has a single ended output may comprise a first PMOS transistor with a source terminal coupled to a positive voltage supply, and a drain terminal of the first PMOS transistor coupled to a source terminal of a second PMOS transistor and to a source terminal of a third PMOS transistor. A fourth PMOS transistor may have a source terminal coupled to the drain terminal of the second PMOS transistor, and a fifth PMOS transistor may have a source terminal coupled to the drain terminal of the third PMOS transistor.

A first NMOS transistor may have a drain terminal coupled to a drain terminal of the fourth PMOS transistor, and a second NMOS transistor may have a drain terminal coupled to a drain terminal of the fifth PMOS transistor, to a gate of the first NMOS transistor, and to a gate of the second NMOS transistor. A source terminal of the first NMOS transistor and a source terminal of the second NMOS transistor may be coupled to ground.

A cascode bias generator with an output terminal may be coupled to a gate of the fourth PMOS transistor, and a gate of the fifth PMOS transistor. An input terminal of the cascode bias generator may receive a first input ramp signal.

Furthermore, a biasing signal may be applied to a gate terminal of the first PMOS transistor, and a second input ramp signal may be applied to a gate terminal of the second PMOS transistor. An input pixel signal may be applied to a gate terminal of the third PMOS transistor, and a cascode biasing signal generated by the cascode bias generator may be applied to a gate terminal of the fourth PMOS transistor and to a gate terminal of the fifth PMOS transistor. The cascode biasing signal, which may be offset by a substantially fixed voltage with respect to the input ramp signal, may track the input ramp signal. An output signal may be at the node where the drain terminal of the fourth PMOS transistor is coupled to the drain terminal of the first NMOS transistor.

An embodiment of the invention for a cascoded comparator with dynamic biasing for column parallel single slope ADCs where the comparator has differential outputs may comprise a first PMOS transistor with a source terminal coupled to a positive voltage supply, and a drain terminal of the first PMOS transistor coupled to a source terminal of each of a second PMOS transistor and a third PMOS transistor. A fourth PMOS transistor with a source terminal may be coupled to the drain terminal of the second PMOS transistor, and a fifth PMOS transistor may have a source terminal coupled to the drain terminal of the third PMOS transistor.

A first NMOS transistor may have a drain terminal coupled to a drain terminal of the fourth PMOS transistor, to a gate terminal of the first NMOS transistor, to a drain terminal of a second NMOS transistor, and to a gate terminal of a third NMOS transistor. A fourth NMOS transistor may have a drain terminal coupled to a drain terminal of the fifth PMOS transistor, to a gate terminal of the fourth NMOS transistor, to a drain terminal of the third NMOS transistor, and to a gate terminal of the second NMOS transistor.

A source terminal of each of the first NMOS transistor, the second NMOS transistor, the third NMOS transistor, the fourth NMOS transistor are coupled to ground. A cascode bias generator may have an output terminal coupled to a gate terminal of the fourth PMOS transistor and to a gate terminal of the fifth PMOS transistor.

Furthermore, a biasing signal may be applied to a gate terminal of the first PMOS transistor. A first input ramp signal may be applied to a gate terminal of the second PMOS transistor, an input pixel signal may be applied to a gate terminal of the third PMOS transistor, and a second input ramp signal may be applied to an input terminal of the cascode bias generator. A cascode biasing signal generated by the cascode bias generator may be applied to a gate terminal of the fourth PMOS transistor and to a gate terminal of the fifth PMOS transistor.

The cascode biasing signal, offset by a substantially fixed voltage from the first input ramp signal, may track the first input ramp signal. A first differential output signal may be at the node where the drain terminals of the first and second NMOS transistors are coupled, and a second differential output signal may be at the node where the drain terminals of the third and fourth NMOS transistors are coupled.

An embodiment of the invention for a cascoded comparator with dynamic biasing for column parallel single slope ADCs may comprise a cascode bias generator, where the cascode bias generator comprises a first PMOS transistor that has a source terminal coupled to a positive voltage supply, and a drain terminal of the first PMOS transistor coupled to a source terminal of a second PMOS transistor and to a source terminal of a third PMOS transistor.

A first NMOS transistor that has a drain terminal coupled to a drain terminal of the second PMOS transistor and to a gate terminal of the second PMOS transistor. The cascode bias generator may comprise a second NMOS transistor that has a drain terminal coupled to a drain terminal of the third PMOS transistor, and to a gate of the second NMOS transistor. A source terminal of the first NMOS transistor and a source terminal of the second NMOS transistor may be coupled to ground.

A first biasing signal applied to a gate terminal of the first PMOS transistor, an input ramp signal applied to a gate terminal of the third PMOS transistor, and a second biasing signal is applied to a gate terminal of the first NMOS transistor.

An output signal, which is the cascode biasing signal, is at the node where the drain terminal of the second PMOS transistor is coupled to the gate terminal of the second PMOS transistor and to the drain terminal of the first NMOS transistor. The output signal, which may be offset by a substantially fixed voltage with respect to the input ramp signal, may track the input ramp signal.

These and other advantages, aspects and novel features of the present invention, as well as details of an illustrated embodiment thereof, will be more fully understood from the following description and drawings.

DETAILED DESCRIPTION OF THE INVENTION

Embodiments of the present invention will be described in detail with reference to the accompanying drawings such that the scope of the present invention can be easily embodied by those skilled in the art.

Certain embodiments of the invention may be found in a method and system for a cascoded comparator with dynamic biasing for column parallel single slope analog to digital comparators (ADCs).

Figure 1:
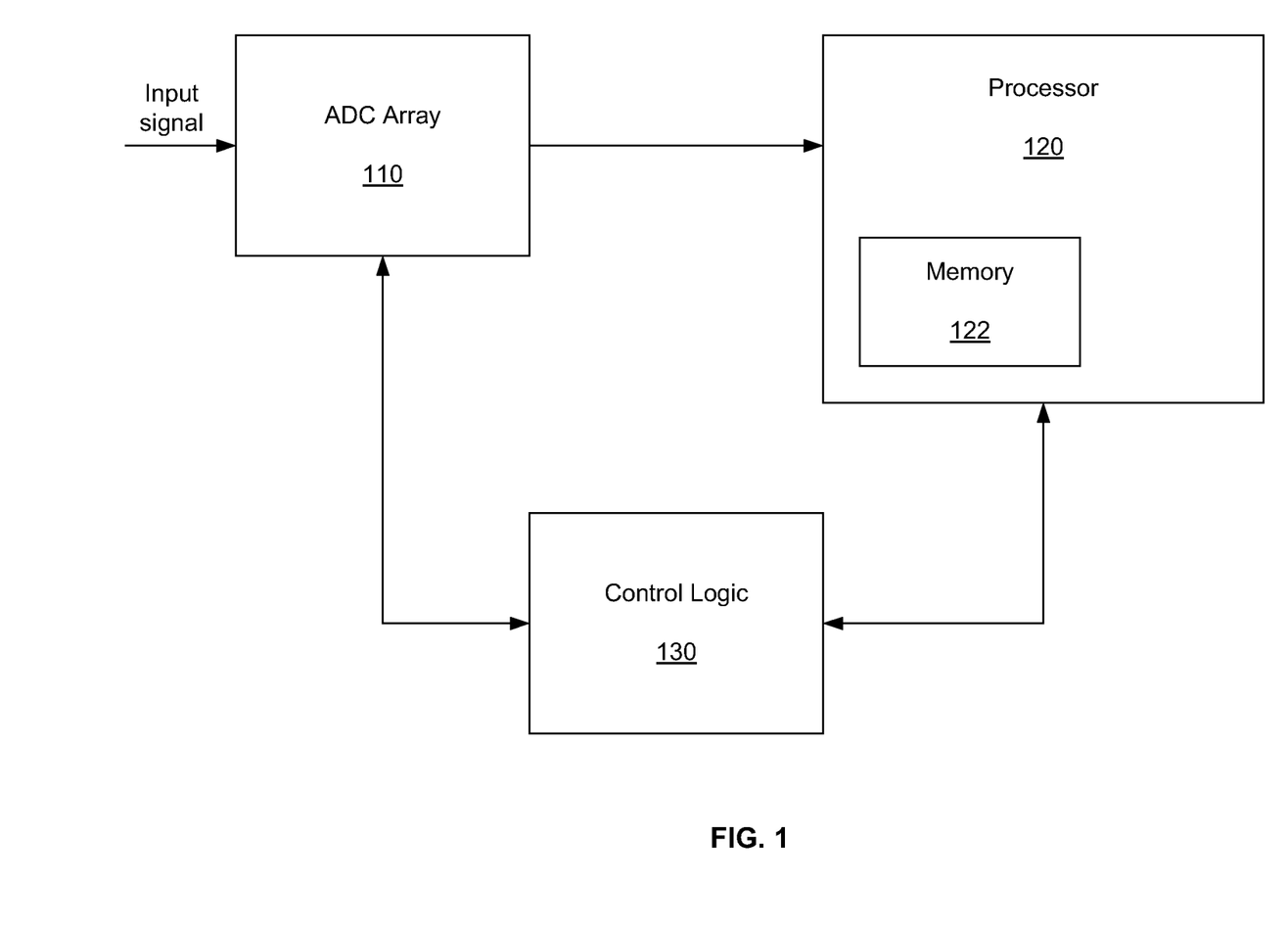
FIG. 1 is a block diagram of exemplary system for analog to digital conversion that may be used with an embodiment of the invention.

FIG. 1 is a block diagram of exemplary system for analog to digital conversion and digital to analog conversion that may be used with an embodiment of the invention. Referring to FIG. 1, there is shown a portion of a circuitry for processing input data, comprising the ADC 110, the processor 120, and the control logic 130.

The ADC 110 converts input analog signals, such as, for example, pixel signals from a video image sensor (not shown in FIG. 1) to equivalent digital signals. The digital signals output by the ADC 110 may be further processed by the processor 120. The processor 120 may, for example, use digital signal processing methods to compress the digital signals from the ADC 110 to a standard video format such as MPEG1, MPEG2, or MPEG4. The processor 120 may also comprise a memory block 122 where code may be stored. This code may be executed by the processor 120 to perform various functions such as, for example, digital signal processing. The memory block 122 may also be used to store digital signals from the ADC 110 and/or digital signals that result from processing the digital signal from the ADC 110.

The control logic 130 may comprise circuitry that generates clocks, control and enable signals, and commands for a variety of modules, such as the ADC 110. For example, the control logic 130 may generate a clock signal that is used for counting in the ADC 110, where the clock signal is not continuously running. A running clock comprises pulses while a non-running clock is in either a low state or a high state. The control logic 130 may also output enable signals that enable the counters in the ADC 110 to count during specific portions of time, and also reset signals.

Figure 2:
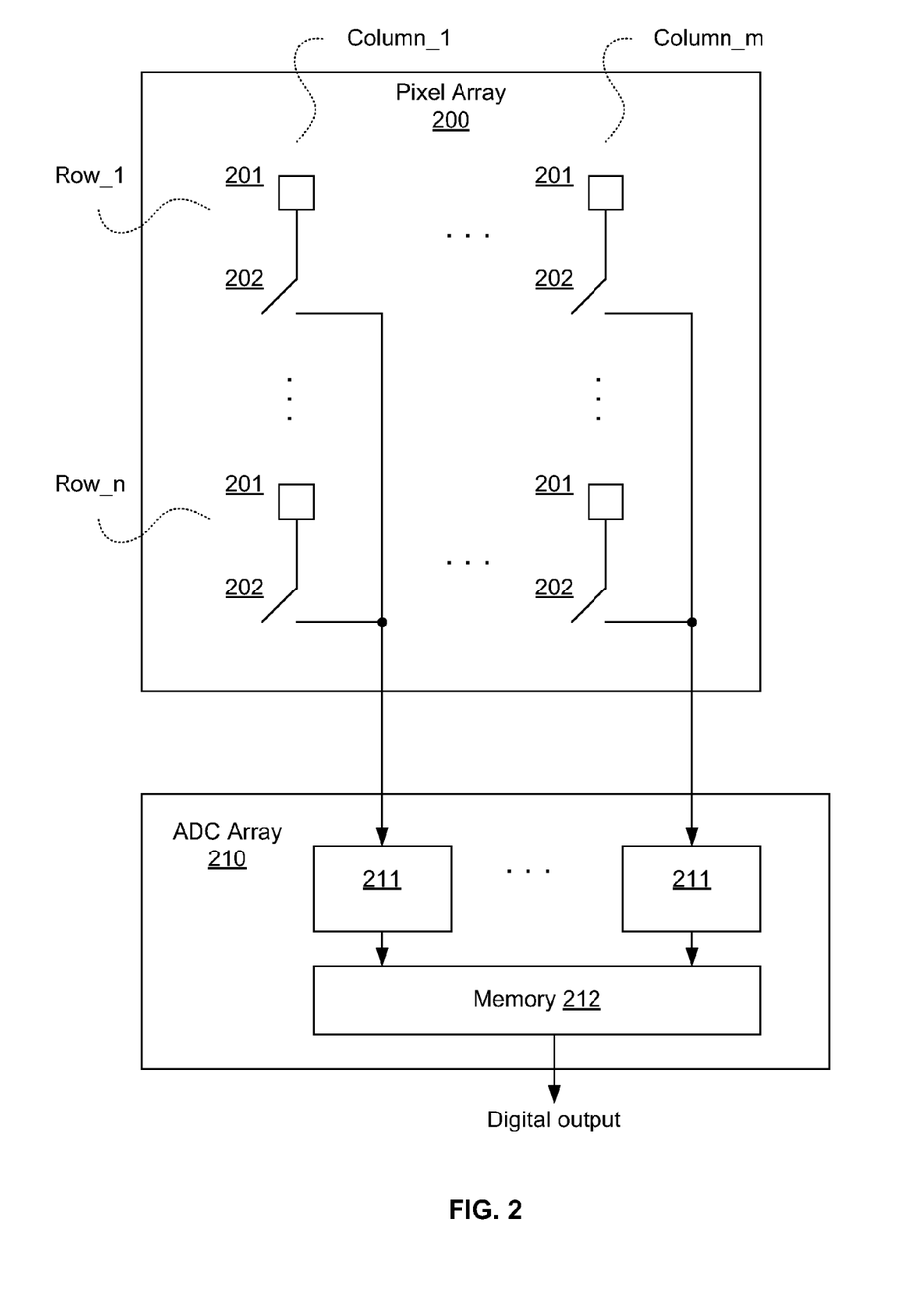
FIG. 2 is a block diagram of an exemplary system for column parallel analog digital converters that may be used with an embodiment of the invention.

FIG. 2 is a block diagram of an exemplary column parallel analog digital converter configuration that may be used with an embodiment of the invention. Referring to FIG. 2, there are shown a pixel array 200 and an ADC array 210. The pixel array 200 may comprise pixel elements 201 and switching elements 202. The pixel elements 201 may comprise suitable circuitry that outputs, for example, voltage proportional to an amount of light detected by the pixel element 201. The pixel element 201 may be sensitive to specific wavelengths of the impinging light. The ADC array 210 may comprise, for example, an array of ADC elements 211, where each ADC element 211 may correspond to a column of the pixel elements 201. The outputs of the ADC elements 211 may be stored in a memory block 212. The ADC element 211 may comprise, for example, a comparator element (not shown) and a counter (not shown).

In operation, appropriate control signals from, for example, the control logic 130 may enable the switching elements 202 to open and close appropriately so that output voltage from a particular pixel element 201 is communicated to the ADC array 210. Accordingly, for each column Column_1 to Column_m, only one particular switch element 202 in all of the rows Row_1 to Row_n may be closed during a row scan time so that output voltage from the corresponding pixel element 201 is communicated to the ADC array 210 during that scan time. Therefore a true pixel voltage may be communicated to a corresponding ADC element 211 when only one pixel is selected for the column.

The output voltage from one of the pixel elements 201 in each of the columns Column_1 to Column_m may be converted to equivalent digital values by the corresponding ADC elements 211. However, since there is a plurality of ADC elements 211, each ADC element 211 may need to be calibrated so that each ADC element 211 outputs a similar digital value for a given input. Calibration may be done periodically, for example, such as once during a row scan time or once during a frame. The particular period for calibration may be design and/or implementation dependent.

Figure 3:
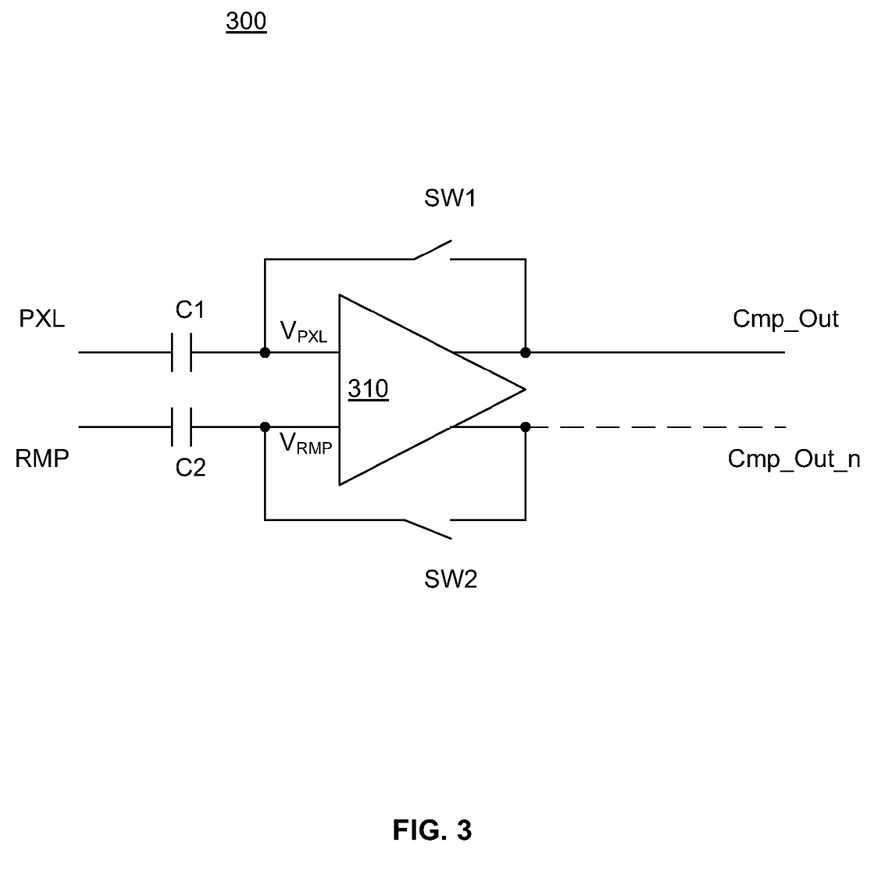
FIG. 3 is a block diagram of an exemplary comparator architecture that may be used with an embodiment of the invention.

FIG. 3 is a block diagram of an exemplary comparator architecture that may be used with an embodiment of the invention. Referring to FIG. 3, there is shown a comparator element 300, which may be similar to the comparator element used in the ADC element 211, comprising comparator 310, coupling capacitors C1 and C2, and switching elements SW1 and SW2.

In operation, the switching elements SW1 and SW2 may be closed by a command from, for example, the control logic 130 to reset inputs of the comparator 310 to a known state. The switching elements SW1 and SW2 may then be opened and the input signals PXL and RMP may be applied. The input signal PXL may be, for example, a voltage from a pixel, and the input signal RMP may be a downward sloping voltage signal.

Generally, the input signal RMP may be at a higher initial voltage level than the input signal PXL. Accordingly, output signal Cmp_out of the comparator 310 may be deasserted. However, as the input signal RMP is decreasing in voltage, there may be a point when the level of the input signal RMP crosses the level of the input signal PXL. As the input signal RMP decreases further and the input signal RMP is less than the as the input signal PXL, the comparator may assert the output signal Cmp_out. The output signal Cmp_out may be communicated to, for example, a counter corresponding to the comparator element 300. The counter may be, for example, part of the same ADC element 211 as the comparator element 300. The control logic 130 may then control various signals that may be used to give a final equivalent digital value of the analog input signal. In cases where the comparator 310 has complementary outputs, there may also be an output signal Cmp_out_n that is of opposite voltage level with respect to the output signal Cmp_out. For example, when the output signal Cmp_out is at a high voltage level, the output signal Cmp_out_n is at a low voltage level, and vice versa.

Figure 4A:
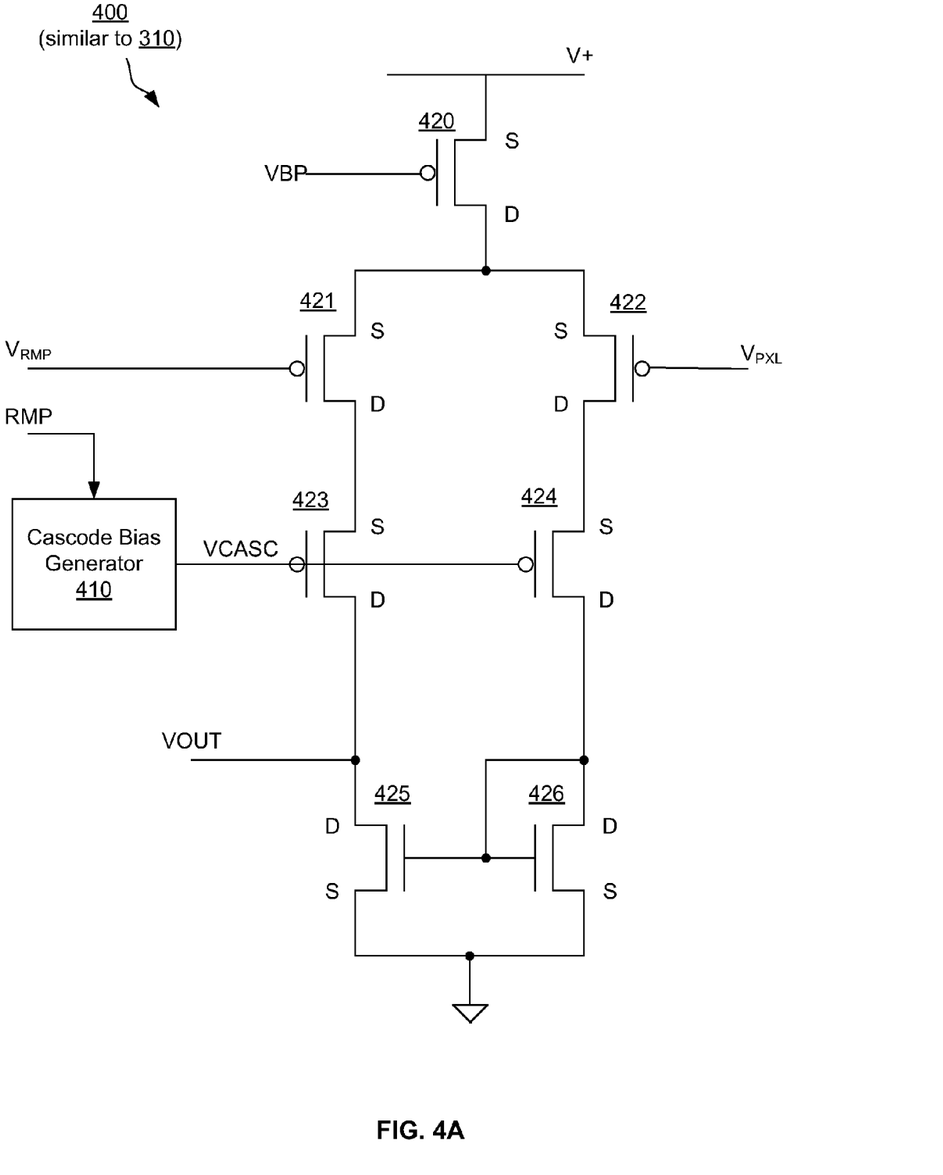
FIG. 4A is a schematic of an exemplary single ended output cascoded comparator in conjunction with a cascode bias generator in accordance with an embodiment of the invention.

FIG. 4A is a schematic of an exemplary single ended output cascoded comparator in conjunction with a cascode bias generator, in accordance with an embodiment of the invention. Referring to FIG. 4A, there is shown an exemplary schematic for a cascoded comparator 400, which may be used in place of the comparator 310.

The comparator 400 comprises a cascode bias generator 410, PMOS transistors 420, 421, 422, 423, and 424, and NMOS transistors 425 and 426. A source terminal of the PMOS transistor 420 is coupled to the voltage supply V+ and a drain terminal of the PMOS transistor 420 is coupled to source terminals of the PMOS transistors 421 and 422. An input signal VBP may be applied to a gate terminal of the PMOS transistor 420. The input signal VBP may be used to bias the PMOS transistor 420 so that the PMOS transistor 420 may be a current source.

A drain terminal of the PMOS transistor 421 is coupled to a source terminal of the PMOS transistor 423, and a drain terminal of the PMOS transistor 422 is couple to a source terminal of the PMOS transistor 424. An input signal $V_{RMP}$ may be applied to a gate terminal of the PMOS transistor 421, and an input signal $V_{PXL}$ may be applied to a gate terminal of the PMOS transistor 422. The input signal $V_{PXL}$ may be a pixel voltage from, for example, a pixel element 201 in the pixel array 200. The input signal $V_{RMP}$ may be a time-varying voltage that ramps from a higher voltage level to a lower voltage level.

A drain terminal of the PMOS transistor 423 is coupled to a drain terminal of the NMOS transistor 425, and a drain terminal of the PMOS transistor 424 is coupled to a drain terminal of the NMOS transistor 426. A biasing signal VCASC may be applied to gate terminals of the PMOS transistors 423 and 424. Accordingly, the biasing signal VCASC may provide the same biasing voltage for the cascode PMOS transistors 423 and 424.

Gate terminals of the NMOS transistors 425 and 426 may be coupled to each other and to the drain terminals of the PMOS transistor 424 and the NMOS transistor 426. Source terminals of the NMOS transistors 425 and 426 may be coupled to ground. Accordingly, the NMOS transistor 426 may be in a diode configuration. A voltage at the node where the drain terminal of the PMOS transistor 423 is coupled to the drain terminal of the NMOS transistor 425 may be VOUT, an output signal of the comparator 400. VOUT may correspond to Cmp_Out in FIG. 3.

The cascode bias generator 410 may comprise suitable circuitry to generate a biasing signal VCASC. The biasing signal VCASC may track, with an offset, an input signal such as, for example, the input signal $V_{RMP}$, and the biasing signal VCASC may be communicated to the cascode PMOS transistors 423 and 424. Accordingly, since the cascode PMOS transistors 423 and 424 are biased by the same biasing voltage from the biasing signal VCASC output by the cascode bias generator 410, the cascode PMOS transistors 423 and 424 may have similar operating characteristics regardless of the level of the input signal $V_{RMP}$.

In operation, the input signal VBP may be applied to the PMOS transistor 420 so that the PMOS transistor 420 may source current for the PMOS transistors 421, 422, 423, and 424, and the NMOS transistors 425 and 426. If the PMOS transistors 423 and 424 are biased with a fixed gate voltage VCASC, then the VSD (source to drain voltage) for the PMOS transistors 421 and 422 may be different when the input signal $V_{RMP}$ crosses the input signal $V_{PXL}$ at different voltage levels of the input signal $V_{PXL}$. Accordingly, the operating characteristics of the PMOS transistors 421 and 422 may vary at different voltage levels of the input signal $V_{PXL}$, which may lead to inaccurate outputs by the output signal VOUT.

However, various embodiments of the invention may use the input signal $V_{RMP}$ as a reference, and the cascode bias generator 410 may provide some offset to the input signal $V_{RMP}$ to generate the biasing signal VCASC. The biasing signal VCASC may be communicated to the gate terminals of the cascode PMOS transistors 423 and 424. Therefore, the input signal $V_{RMP}$ and biasing signal VCASC are substantially identical ramp signals that are separated by a fixed offset. Accordingly, the VSD of the comparator input pair, PMOS transistors 421 and 422, may be constant regardless of the voltage level of the input signal RMP. Accordingly, the operating characteristics of the PMOS transistors 421 and 422 will be the same regardless of the voltage level of the input signal RMP.

Figure 4B:
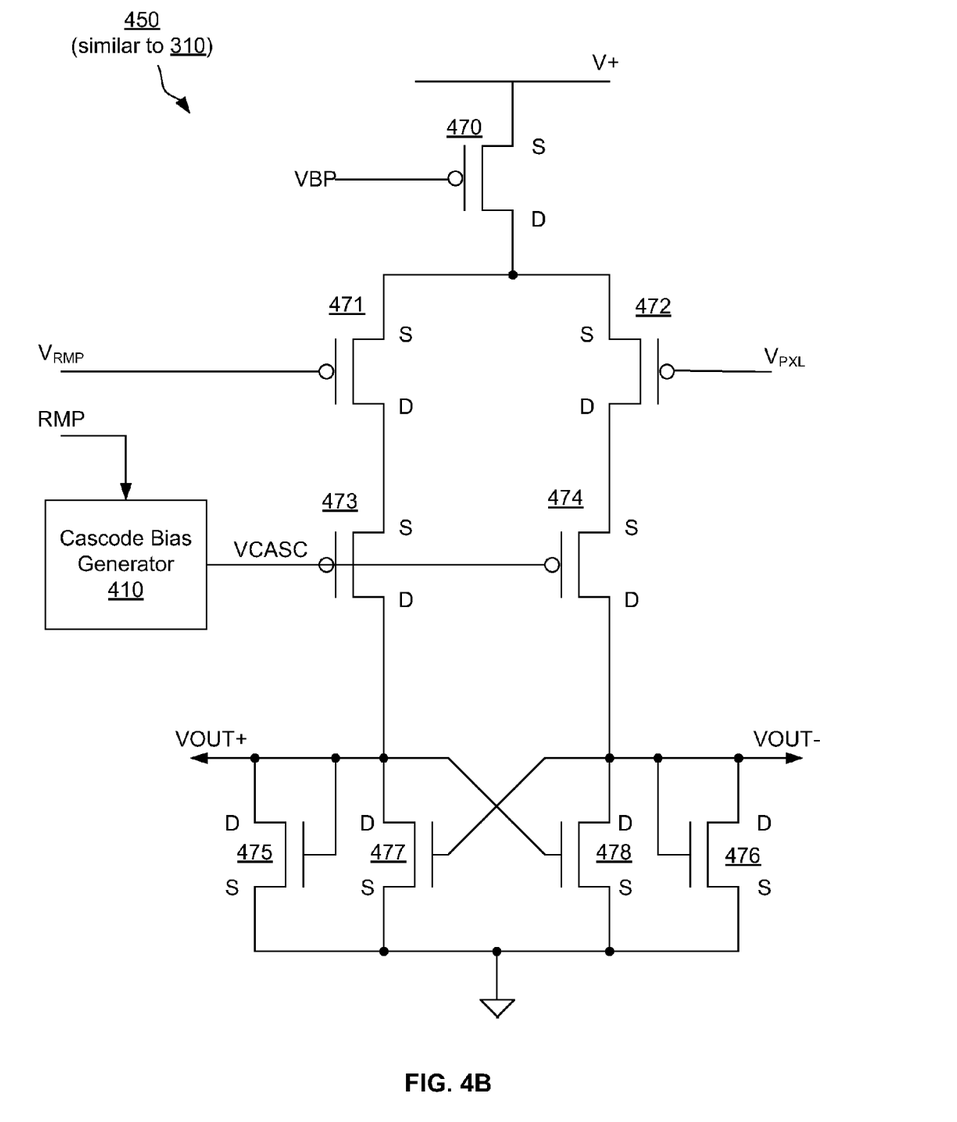
FIG. 4B is a schematic of an exemplary differential output cascoded comparator in conjunction with a cascode bias generator in accordance with an embodiment of the invention.

FIG. 4B is a schematic of an exemplary differential output cascoded comparator, in accordance with an embodiment of the invention. Referring to FIG. 4B, there is shown an exemplary schematic for a cascoded comparator 450, which may be used in place of the comparator 310.

The cascoded comparator 450 may be similar to the cascoded comparator 400 except for the output section. Accordingly, the cascoded comparator 450 comprises the cascode bias generator 410, the PMOS transistors 470, 471, 472, 473 and 474 and the NMOS transistors 475 and 476. Additionally, the cascoded comparator 450 comprises NMOS transistors 477 and 478.

A source terminal of the PMOS transistor 470 is coupled to the voltage supply V+ and a drain terminal of the PMOS transistor 470 is coupled to source terminals of the PMOS transistors 471 and 472. An input signal VBP may be applied to a gate terminal of the PMOS transistor 470. The input signal VBP may be used to bias the PMOS transistor 470 so that the PMOS transistor 470 may be a current source.

A drain terminal of the PMOS transistor 471 is coupled to a source terminal of the PMOS transistor 473, and a drain terminal of the PMOS transistor 472 is couple to a source terminal of the PMOS transistor 474. An input signal $V_{RMP}$ may be applied to a gate terminal of the PMOS transistor 471, and an input signal $V_{PXL}$ may be applied to a gate terminal of the PMOS transistor 472. The input signal $V_{PXL}$ may be a pixel voltage from, for example, a pixel element 201 in the pixel array 200. The input signal $V_{RMP}$ may be a time-varying voltage that ramps from a higher voltage level to a lower voltage level.

A drain terminal of the PMOS transistor 473 is coupled to a drain terminal of the NMOS transistor 475, a gate terminal of the NMOS transistor 475, a drain terminal of the NMOS transistor 477, and a gate terminal of the NMOS transistor 428. A drain terminal of the PMOS transistor 424 is coupled to a drain terminal of the NMOS transistor 476, a gate terminal of the NMOS transistor 476, a drain terminal of the NMOS transistor 478, and a gate terminal of the NMOS transistor 427. Source terminals of the NMOS transistors 475, 476, 477, and 478 may be coupled to ground. Accordingly, the NMOS transistors 475 and 476 may be in a diode configuration.

A biasing signal VCASC may be applied to gate terminals of the PMOS transistors 473 and 474. Accordingly, the biasing signal VCASC may provide the same biasing voltage for the cascode PMOS transistors 473 and 474. A voltage at the drain terminal of the NMOS transistor 475 may be VOUT+, an output signal of the comparator 400. A voltage at the drain terminal of the NMOS transistor 476 may be VOUT−, an output signal of the comparator 400. VOUT+ and VOUT− may correspond to Cmp_Out and Cmp_Out_n in FIG. 3.

The cascode bias generator 410 may comprise suitable circuitry to generate a biasing signal VCASC. The biasing signal VCASC may track, with an offset, an input signal such as, for example, the input signal $V_{RMP}$, and the biasing signal VCASC may be communicated to the cascode PMOS transistors 473 and 474. Accordingly, since the cascode PMOS transistors 473 and 474 are biased by the same biasing voltage from the biasing signal VCASC output by the cascode bias generator 410, the cascode PMOS transistors 473 and 474 may have similar operating characteristics regardless of the level of the input signal $V_{RMP}$.

In operation, the input signal VBP may be applied to the PMOS transistor 470 so that the PMOS transistor 470 may source current for the PMOS transistors 471, 472, 473, and 474, and the NMOS transistors 475, 476, 477, and 478. If the PMOS transistors 473 and 474 are biased with a fixed gate voltage VCASC, then the VSD (source to drain voltage) for the PMOS transistors 471 and 472 may be different when the input signal $V_{RMP}$ crosses the input signal $V_{PXL}$ at different voltage levels of the input signal $V_{PXL}$. Accordingly, the operating characteristics of the PMOS transistors 471 and 472 may vary at different voltage levels of the input signal $V_{PXL}$, which may lead to inaccurate outputs by the output signals VOUT+ and VOUT−.

However, various embodiments of the invention may use the input signal $V_{RMP}$ as a reference, and the cascode bias generator 410 may provide some offset to the input signal $V_{RMP}$ to generate the biasing signal VCASC. The biasing signal VCASC may be communicated to the gate terminals of the cascode PMOS transistors 473 and 474. Therefore, the input signal $V_{RMP}$ and biasing signal VCASC are substantially identical ramp signals that are separated by a fixed offset. Accordingly, the VSD of the comparator input pair, PMOS transistors 471 and 472, may be constant regardless of the voltage level of the input signal RMP. Accordingly, the operating characteristics of the PMOS transistors 471 and 472 will be the same regardless of the voltage level of the input signal RMP.

Figure 5:
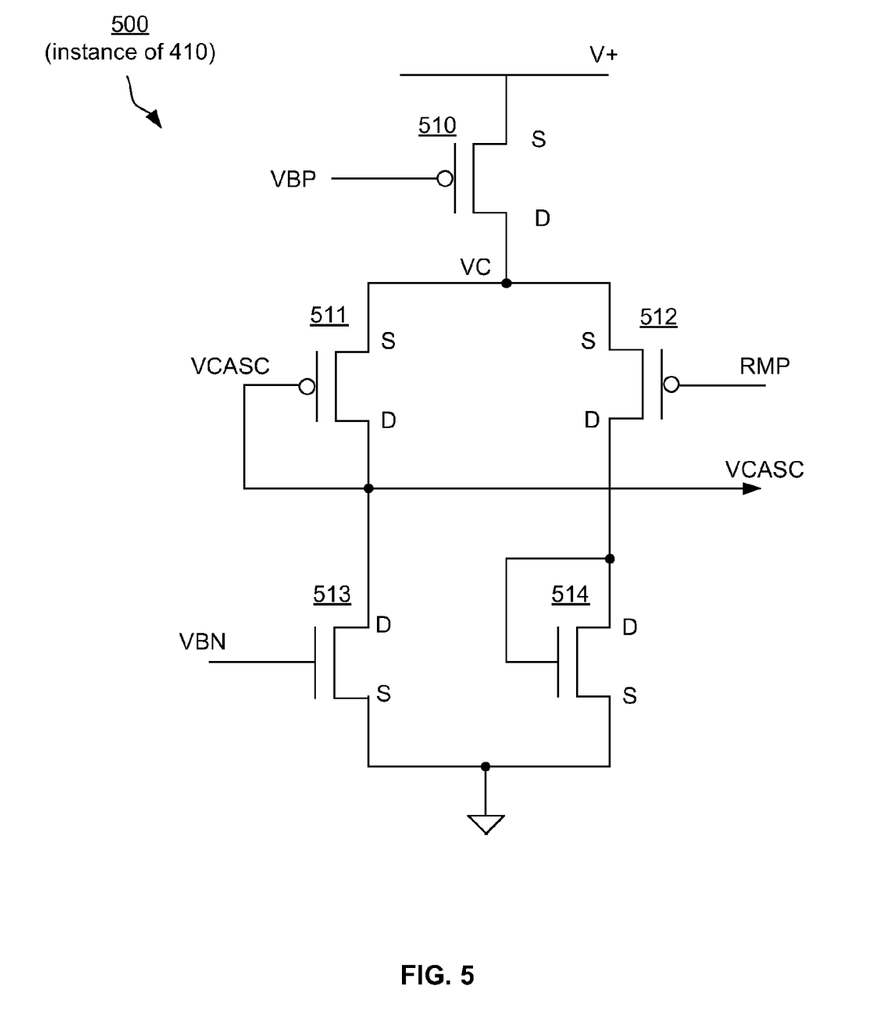
FIG. 5 is a schematic of an exemplary dynamic biasing circuitry in accordance with an embodiment of the invention.

FIG. 5 is a schematic of an exemplary dynamic biasing circuitry, in accordance with an embodiment of the invention. Referring to FIG. 5, there is shown an exemplary schematic for a cascode bias generator 500 that may be similar to, for example, the cascode bias generator 410.

The cascode bias generator 500 comprises PMOS transistors 510, 511, and 512, and NMOS transistors 513 and 514. A source terminal of the PMOS transistor 510 is coupled to a voltage supply V+, and a drain terminal of the PMOS transistor 510 is coupled to source terminals of the PMOS transistors 511 and 512. A voltage at this node where the PMOS transistors 510, 511, and 512 are coupled to each other may be referred to as a common voltage VC. An input signal VBP may be applied to a gate terminal of the PMOS transistor 510. The input signal VBP may be, for example, the same input signal VBP used to bias the PMOS transistor 420, and may also be used to bias the PMOS transistor 510 so that the PMOS transistor 510 may be a current source.

A drain terminal of the PMOS transistor 511 is coupled to a gate terminal of the PMOS transistor 511 and also to a drain terminal of the NMOS transistor 513. Accordingly, the PMOS transistor 511 may be configured as a diode. Voltage at the node where the drain terminal of the PMOS transistor 511 is coupled to the drain terminal of the NMOS transistor 513 may be the biasing signal VCASC, an output signal of the cascode bias generator 500.

A drain terminal of the PMOS transistor 512 is coupled to a drain terminal of the NMOS transistor 514 and to a gate terminal of the NMOS transistor 514. Accordingly, the NMOS transistor 514 may be configured as a diode. An input signal RMP may be supplied to a gate terminal of the PMOS transistor 512. Source terminals of the NMOS transistors 513 and 514 is coupled to ground. An input signal VBN may be supplied to a gate terminal of the NMOS transistor 513. The input signal VBN may be a biasing signal so that the NMOS transistor 513 may be a current sink.

In operation, the PMOS transistor 510 and the NMOS transistor 513 may be biased by the biasing signals VBP and VBN, respectively. The input signal RMP may be the same input signal RMP that is applied to the comparator 400 is applied. As the input signal RMP changes, the common voltage VC tracks voltage of the input signal RMP with an offset of VGS_512, which is a gate to source voltage for the PMOS transistor 512.

Since the common voltage VC is also applied to the source terminal of the PMOS transistor 511, voltage of the biasing signal VCASC also tracks voltage of the input signal RMP with an offset of VGS_512−VGS_511, where VGS_511 is a gate to source voltage for the PMOS transistor 511. By adjusting a width to length (W/L) ratio of the PMOS transistor 511 so that VGS_511>VGS_512, the voltage level of the biasing signal VCASC can be lower than the voltage level of the input signal RMP by a desired voltage. The desired voltage may be a voltage determined to properly bias, for example, the cascode PMOS transistors 423 and 424 in the comparator 400.

Since the PMOS transistor 510 supplies a fixed current I, if the NMOS transistor 513 sinks a fixed current I/2 then the remaining current I/2 from the PMOS transistor 510 must flow through the PMOS transistor 512 and the NMOS transistor 514. As the input signal RMP changes, the diode connection of the NMOS transistor 514 may allow some dynamic current to be steered to/from the PMOS transistor 511 to charge/discharge the output node where the biasing signal VCASC is present. However, as described earlier, the current relationship between the various transistors ensures that the biasing signal VCASC will always track the input signal RMP.

Although some embodiments of the invention have been described, the invention is not so limited. For example, while specific transistors may have been described as being NMOS transistors and others as being PMOS transistors, these specific transistors may be changed to different types to perform the desired functions of various embodiments of the invention. Additionally, various other circuitry may be designed as various embodiments of the invention.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
   receiving a first input signal and a second input signal via respective first and second input transistors;
   providing a predetermined offset to the first input signal to generate a biasing signal that tracks, with a fixed offset, the first input signal;
   applying the biasing signal to first and second cascode transistors respectively cascoded to the first and second input transistors,
   providing the biasing signal from a cascode bias generator, the cascode bias generator comprising:
      a first transistor having its source terminal coupled to a voltage supply and its drain terminal coupled to source terminals of second and third transistors;
      the second transistor having its gate terminal coupled to its drain terminal; and
      the biasing signal generated by the cascode bias generator is derived from the drain terminal of the second transistor.

2. The method according to claim 1, wherein the first input signal and the biasing signal are downwardly ramping voltage signals.

3. The method according to claim 1, wherein the second input signal is a sampled pixel voltage.

4. The method according to claim 1, wherein an output signal is dependent on comparison of a voltage level of the first input signal to a voltage level of the second input signal.

5. The method according to claim 1, wherein the first and second input transistors are PMOS transistors.

6. The method according to claim 1, wherein the first and second cascode transistors are PMOS transistors.

7. A system for processing signals, the system comprising:
   a first input transistor and a second input transistor enabled to receive, respectively, a first input signal and a second input signal;
   a first cascode transistor and a second cascode transistor respectively cascoded to the first input transistor and the second input transistor; and
   a cascode bias generator, enabled to receive a third input signal, that generates a biasing signal that tracks, with a fixed offset, the first input signal,
   wherein the biasing signal is applied to gate terminals of the first cascode transistor and the second cascode transistor,
   wherein the cascode bias generator is configured to provide the fixed offset to the first input signal, and to generate the biasing signal, and
   wherein the cascade bias generator comprises:
      a first transistor having its source terminal coupled to a voltage supply and its drain terminal coupled to source terminals of second and third transistors;
      the third transistor having the third input signal coupled to its gate terminal;
      the second transistor having its gate terminal coupled to its drain terminal; and
      the biasing signal generated by the cascode bias generator is derived from the drain terminal of the second transistor.

8. The system according to claim 7, wherein the first input signal is a downwardly ramping voltage signal.

9. The system according to claim 7, wherein the second input signal is a sampled pixel voltage.

10. The system according to claim 7, wherein an output signal is dependent on comparison of a voltage level of the first input signal to a voltage level of the second input signal.

11. The system according to claim 7, wherein the first and second input transistors are PMOS transistors.

12. The system according to claim 7, wherein the first and second cascode transistors are PMOS transistors.

13. Circuitry for processing signals, the circuitry comprising:
- a first PMOS transistor with a source terminal coupled to a positive voltage supply;
- a drain terminal of the first PMOS transistor coupled to a source terminal of each of a second PMOS transistor and a third PMOS transistor;
- a fourth PMOS transistor with a source terminal coupled to the drain terminal of the second PMOS transistor;
- a fifth PMOS transistor with a source terminal coupled to the drain terminal of the third PMOS transistor;
- a first NMOS transistor with a drain terminal coupled to a drain terminal of the fourth PMOS transistor;
- a second NMOS transistor with a drain terminal coupled to a drain terminal of the fifth PMOS transistor, to a gate of the first NMOS transistor, and to a gate of the second NMOS transistor;
- a source terminal of each of the first NMOS transistor and second NMOS transistor coupled to ground; and
- a cascode bias generator with an output terminal coupled to a gate terminal of the fourth PMOS transistor and to a gate terminal of the fifth PMOS transistor wherein an output signal of the cascode bias generator and a gate signal of the second PMOS transistor are substantially identical and are separated by a fixed offset, and wherein the cascade bias generator comprises:
- a first transistor having its source terminal coupled to a voltage supply and its drain terminal coupled to source terminals of second and third transistors;
- the second transistor having its gate terminal coupled to its drain terminal;
- a fourth transistor having its drain terminal coupled to the drain of the second transistor;
- a fifth transistor having its drain terminal coupled to the drain of the third transistor;
- a source terminal of the fourth transistor and a source terminal of the fifth transistor each coupled to ground; and
- the gate terminal and drain terminal of the second transistor each coupled to the gate terminal of the fourth PMOS transistor.

14. The circuitry according to claim 13, wherein the gate signal of the second PMOS transistor is a first input ramp signal, and further comprising:
- a biasing signal applied to a gate terminal of the first PMOS transistor;
- an input pixel signal is applied to a gate terminal of the third PMOS transistor;
- a second input ramp signal is applied to an input terminal of the cascode bias generator; and
- a cascode biasing signal generated by the cascode bias generator is applied to a gate terminal of the fourth PMOS transistor and to a gate terminal of the fifth PMOS transistor.

15. The circuitry according to claim 14, wherein the cascode biasing signal, offset by a substantially fixed voltage from the first input ramp signal, tracks the first input ramp signal.

16. The circuitry according to claim 13, wherein an output signal is at the node where the drain terminal of the fourth PMOS transistor is coupled to the drain terminal of the first NMOS transistor.

17. A system for processing signals, the system comprising:
- an input circuit part configured to receive a first ramp signal and a pixel signal;
- a cascode circuit part configured to receive a cascode biasing signal and coupled to the input circuit part;
- an output circuit part coupled to the cascode circuit part; and
- a cascode bias generator configured to receive a second ramp signal to provide a fixed offset to the first ramp signal, and to generate the cascode biasing signal, wherein the cascode bias generator comprises:
  - a first transistor having its source terminal coupled to a voltage supply and its drain terminal coupled to source terminals of second and third transistors;
  - the third transistor having the second ramp signal coupled to its gate terminal;
  - the second transistor having its gate terminal coupled to its drain terminal; and
  - the cascode biasing signal generated by the cascode bias generator is derived from the drain terminal of the second transistor.

18. A system for processing signals, the system comprising:
- a first input transistor and a second input transistor enabled to receive, respectively, a first input signal and a second input signal;
- a first cascode transistor and a second cascode transistor respectively cascoded to the first input transistor and the second input transistor; and
- a cascode bias generator, enabled to receive a third input signal, that generates a biasing signal that tracks, with a fixed offset, the first input signal, wherein the cascode bias generator comprises:
- a first PMOS transistor configured to operate as a current source, the first PMOS transistor having its source terminal coupled to a positive voltage supply and its drain terminal coupled to source terminals of second and third PMOS transistors;
- the third PMOS transistor having the first input signal coupled to its gate terminal;
- the second PMOS transistor having its gate terminal coupled to its drain terminal, and having its width-to-length ratio (W/L) appropriately adjusted such that gate-to-source voltage of the second PMOS transistor is always greater than gate-to-source voltage of the third PMOS transistor by a predetermined amount; and
- the biasing signal generated by the cascode bias generator is derived from the drain terminal of the second PMOS transistor;

wherein the biasing signal is applied to gate terminals of the first cascode transistor and the second cascode transistor, and source-to-drain voltages of the first input transistor and the second input transistor are substantially constant, independent of the voltage level of the third input signal.

19. A system for processing signals, the system comprising:
- an input circuit part configured to receive a first ramp signal and a pixel signal;
- a cascode circuit part configured to receive a cascode biasing signal and coupled to the input circuit part;
- an output circuit part coupled to the cascode circuit part; and
- a cascode bias generator configured to receive a second ramp signal to provide a fixed offset to the first ramp signal, and to generate the cascode biasing signal, wherein the cascode bias generator comprises:
  - a first PMOS transistor configured to operate as a current source, the first PMOS transistor having its source terminal coupled to a positive voltage supply and its drain terminal coupled to source terminals of second and third PMOS transistors;

the third PMOS transistor having the second ramp signal coupled to its gate terminal;

the second PMOS transistor having its gate terminal coupled to its drain terminal, and having its width-to-length ratio (W/L) appropriately adjusted such that gate-to-source voltage of the second PMOS transistor is always greater than gate-to-source voltage of the third PMOS transistor by a predetermined amount; and the cascode biasing signal generated by the cascode bias generator is derived from the drain terminal of the second PMOS transistor.

* * * * *